United States Patent
Lee et al.

(10) Patent No.: US 9,406,777 B2
(45) Date of Patent: Aug. 2, 2016

(54) METHOD FOR MANUFACTURING A TRANSISTOR DEVICE

(71) Applicants: IMEC VZW, Leuven (BE); Samsung Electronics Co. Ltd., Suwon-si, Gyeonggi-do (KR)

(72) Inventors: Seung Hun Lee, Seoul (KR); Geert Eneman, Balen (BE)

(73) Assignees: IMEC VZW, Leuven (BE); Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 14/667,376

(22) Filed: Mar. 24, 2015

(65) Prior Publication Data

US 2015/0287807 A1    Oct. 8, 2015

(30) Foreign Application Priority Data

Apr. 8, 2014   (EP) .................................... 14163805

(51) Int. Cl.
*H01L 29/66* (2006.01)
*H01L 21/3065* (2006.01)
(Continued)

(52) U.S. Cl.
CPC ...... *H01L 29/66545* (2013.01); *H01L 21/3065* (2013.01); *H01L 21/3083* (2013.01); *H01L 29/1054* (2013.01); *H01L 29/66636* (2013.01); *H01L 29/7848* (2013.01); *H01L 29/165* (2013.01); *H01L 29/267* (2013.01)

(58) Field of Classification Search
CPC .............. H01L 21/336; H01L 31/0328; H01L 21/3063; H01L 29/66545; H01L 29/66
USPC .......................................... 438/285; 257/280
See application file for complete search history.

(56) References Cited

U.S. PATENT DOCUMENTS

| 2004/0178406 A1 | 9/2004 | Chu |
| 2005/0106792 A1 | 5/2005 | Cea et al. |

(Continued)

FOREIGN PATENT DOCUMENTS

| JP | H07226501 A | 8/1995 |
| JP | 2007288165 | 11/2007 |

(Continued)

OTHER PUBLICATIONS

Chang, J.C., et al., "Strain relaxation of compositionally graded In x Ga1x As buffer layers for modulationdoped In0.3Ga0.7As/In0.29Al0.71As heterostructures," Applied Physics Letters, vol. 60, No. 9, p. 1129-1131 (1992).

(Continued)

*Primary Examiner* — Phuc Dang
(74) *Attorney, Agent, or Firm* — McDonnell Boehnen Hulbert & Berghoff LLP (57) ABSTRACT

A method for manufacturing a transistor device comprising a channel layer is disclosed. In one example, the method includes providing a substrate, epitaxially growing a strained layer on the substrate (defect free), epitaxially growing the channel layer on the epitaxially grown strained layer, and providing a gate structure on the channel layer. In this example, the method also includes selectively etching into the channel layer and at least partially in the epitaxially grown strained layer, thereby using the gate structure as a mask, and thereby creating a protrusion extending from the substrate. The protrusion may comprise a portion of the channel layer and at least an upper portion of the epitaxially grown strained layer, and may allow for elastic relaxation in the portions.

14 Claims, 7 Drawing Sheets

(51) Int. Cl.
*H01L 21/308* (2006.01)
*H01L 29/78* (2006.01)
*H01L 29/10* (2006.01)
*H01L 29/165* (2006.01)
*H01L 29/267* (2006.01)

(56) References Cited

U.S. PATENT DOCUMENTS

| | | | |
|---|---|---|---|
| 2006/0081876 A1* | 4/2006 | Monfray | H01L 29/0649 257/192 |
| 2006/0151787 A1 | 7/2006 | Chen et al. | |
| 2007/0254423 A1* | 11/2007 | Chidambarrao | H01L 21/823807 438/197 |
| 2007/0257249 A1* | 11/2007 | Mocuta | H01L 21/823807 257/19 |
| 2008/0014721 A1 | 1/2008 | Bauer | |
| 2013/0011983 A1 | 1/2013 | Tsai et al. | |
| 2015/0091091 A1* | 4/2015 | Liu | H01L 29/105 257/365 |
| 2015/0287826 A1* | 10/2015 | Cheng | H01L 29/7848 257/20 |

FOREIGN PATENT DOCUMENTS

| | | |
|---|---|---|
| JP | 2010-171337 | 8/2010 |
| WO | 2013/154574 | 10/2013 |

OTHER PUBLICATIONS

Bogumilowicz, Y., "Chemical vapour etching of Si, SiGe and Ge with HCl; applications to the formation of thin relaxed SiGe buffers and to the revelation of threading dislocations," Semicond. Sci. Technol. vol. 20, p. 127-134 (2005).

Loo, R., et al., "Formation of misfit dislocations at the thin strained Sistrain-relaxed buffer interface," Applied Physics Letters, Applied Physics Letters, vol. 87, p. 18208-1-3 (2005).

Taraschi, G., et al., "Relaxed SiGe-on-insulator fabricated via wafer bonding and etch back," J. Vac. Sci. Technol., vol. 20, No. 2, p. 725 727 (2002).

Partial European Search Report, Application No. EP 15159942, Sep. 2, 2015.

\* cited by examiner

| FET type | Strained buffer | Channel | S/D epi |
|---|---|---|---|
| NFET | SiGe 20-60% Ge | Si | Si:C 0-5%C |
| PFET | Si:C 0-5% C | Si | SiGe 20-60%Ge |
| PFET | SiGe 25% Ge | SiGe 50% | SiGe 20-60%Ge |
| NFET | InAs | $In_{0.53}Ga_{0.47}As$ | $In_{0.3}Ga_{0.7}As$ |
| NFET | $In_{0.7}Ga_{0.3}As$ | $In_{0.53}Ga_{0.47}As$ | $In_{0.3}Ga_{0.7}As$ |
| NFET | $In_yGa_{1-y}As$ y>x | $In_xGa_{1-x}As$ | $In_zGa_{1-z}As$ z<y |

Figure 4 ively grown strained buffer layer. The strained buffer layer may comprise SiGe or Si:C.

METHOD FOR MANUFACTURING A TRANSISTOR DEVICE

CROSS-REFERENCE TO RELATED APPLICATIONS

The present application is a non-provisional patent application claiming priority to European Patent Application No. 14163805.6 filed Apr. 8, 2014, the contents of which are hereby incorporated by reference.

FIELD OF THE DISCLOSURE

The present disclosure relates to methods for manufacturing transistor devices.

BACKGROUND

A transistor typically comprises a channel, for instance as a channel layer or region, connecting a source and a drain region. A channel is provided with a gate contact, for controlling a current going through the channel between source and drain.

The skilled person knows that the amount of stress in the channel region needs to be controlled, as it is an important parameter defining the properties of the transistor device.

Typically, a strain relaxed buffer layer (SRB) is applied between the base substrate, e.g. a silicon substrate, and an active semiconductor layer which embodies the channel. Such a SRB layer is known to be an efficient stressor for a channel layer, for instance for a channel layer of a FINFET transistor device.

The inherent nature of these SRB layers is such that they comprise defects, for instance misfit dislocations, threading dislocations, twin defects etc. Such defects are unwanted for CMOS applications as they may for instance increase leakage current, degrade mobility and decrease yield of working devices.

Defect reduction techniques for SRB layers currently exist, but are costly and/or difficult in use. These techniques rely for instance in increasing thickness of the SRB layer and/or applying Aspect Ratio Trapping (ART) techniques.

Still, threading dislocation densities for SRB layers remain high, and have not been demonstrated to be lower than $10^5/cm^2$.

There exists a need for alternative stressor techniques for a channel layer of transistor devices.

SUMMARY

The present disclosure provides a method for manufacturing a transistor device having a channel layer with a very low defect density or a completely defect-free channel layer.

This aim is achieved according to the disclosure with a method showing the technical characteristics of the first independent claim.

In a first aspect of the present disclosure, a method is disclosed for manufacturing a transistor device having a channel layer, the method comprising: providing a substrate; epitaxially growing a strained layer on the substrate (defect free); epitaxially growing the channel layer on the epitaxially grown strained layer; providing a gate structure on the channel layer; selectively etching into the channel layer and at least partially in the epitaxially grown strained layer, thereby using the gate structure as a mask, and thereby creating a protrusion (located under the gate structure) extending from the substrate, the protrusion comprising a portion of the channel layer and at least an upper portion of the epitaxially grown strained layer, allowing elastic relaxation in the portions.

The transistor device can be of the planar or non-planar type. It can for instance be a transistor of the FINFET type.

A gate structure may comprise a dummy gate material, in case of a dummy gate structure, or can comprise a dielectric layer or layer stack with a metal layer or metal layer stack on top, positioned between a set of spacer structures.

In the case of elastic relaxation, the stress in a layer relaxes due to topography and not due to formation of crystal defects. During elastic relaxation a very small number (<1 defect per million devices) or no defects are introduced in the respective layers. During elastic relaxation of the respective portions, their in-plane dimensions may increase by more than 0.1%, for instance more than 0.5%, for instance more than 1%. Such a relaxation introduces stress in the channel layer. When applying predetermined material layers, the induced stress in the channel layer can be engineered. The channel layer itself will though not comprise a substantial amount of defects (<0.001 defects per square cm chip area), or will not comprise any defects, due to the original epitaxial growth of the channel layer on the epitaxially grown strained layer.

According to example embodiments, the method comprises fully etching through the epitaxially grown strained layer and at least partially into the substrate, the protrusion further comprising an upper portion of the substrate.

Thus, the strained layer is allowed to relax over its whole thickness, increasing the total amount of stress which can be transferred to the channel layer.

According to example embodiments, selectively etching into the channel layer and at least partially in the epitaxially grown strained layer is such that it results in an inwardly, straight, or outwardly curved sidewall of the protrusion. In an example embodiment, the sidewall is inwardly curved. This may comprise one or more selective etching steps.

According to example embodiments, selective etching may include plasma-enhanced etching with HBr, $O_2$, $CF_4$ or $NF_3$ chemistries. By changing the properties of the plasma pulses, inwardly, outwardly curved or straight sidewalls can be created.

According to example embodiments, the method further comprises epitaxially growing source and drain structures directly adjacent to the protrusion and at opposed sides thereof. An example embodiment may use a Chemical Vapour Deposition process using carrier gases like silane, germane and trisilane. These source and drain structures are epitaxially grown on the sidewalls of the protrusion and the exposed upper surface of the underlying layer, for instance the strained layer or substrate, and will further induce stress in the protrusion and thus channel layer. These source and drain structures may comprise silicon germanium or Si:C, in case of a silicon or Silicon germanium channel layer. These source and drain structures may comprise InGaAs, in case of an InGaAs channel layer.

According to example embodiments, the gate structure is a dummy gate structure, and the method further comprises replacing the dummy gate structure by a final gate structure, after epitaxially growing source and drain structures directly adjacent, and thus in direct physical contact, to the protrusion.

According to example embodiments, the final gate structure comprises at least a dielectric layer and a metal layer stack.

According to example embodiments, the substrate is a silicon substrate, in combination with a strained buffer layer which comprises SiGe or Si:C. The substrate can for instance also be an InP substrate, or a silicon substrate with an epitaxially grown InP virtual buffer, in combination with a strained buffer layer which comprises $In_{1-x}Ga_xAs$ or InAs.

In example embodiments, a strained buffer layer comprising SiGe is combined with a Silicon or SiGe channel layer.

In example embodiments, a strained buffer layer comprising Si:C is combined with a silicon channel layer.

In example embodiments, a strained buffer layer comprising InAs is combined with an InGaAs channel layer.

In example embodiments, a strained buffer layer comprising InAs or InGaAs is combined with an InGaAs channel layer.

According to example embodiments, the transistor device is of the nFET type, wherein the epitaxially grown strained layer comprises SiGe with a germanium concentration in between 20 and 60%, wherein the channel layer comprises Silicon, and wherein the source and drain structures comprise Si:C, with a concentration of C being in between 0 and 5%.

According to example embodiments, the transistor device is of the pFET type, wherein the epitaxially grown strained layer comprises Si:C, with a concentration of C being in between 0 and 5%, wherein the channel layer comprises Silicon, and where the source and drain structures comprise SiGe with a germanium concentration in between 20 and 60%.

According to example embodiments, the transistor device is of the pFET type, wherein the epitaxially grown strained layer comprises SiGe with a Germanium concentration of about 25%, wherein the channel layer comprises SiGe with a Germanium concentration higher than 30% (e.g. about 50%), and where the source and drain structures comprise SiGe with a germanium concentration in between 20 and 60%.

According to example embodiments, the transistor device is of the nFET type, wherein the epitaxially grown strained layer comprises InAs, wherein the channel layer comprises InGaAs, comprising about 53% In, and about 47% Ga, and wherein the source and drain structures comprise InGaAs, comprising about 30% In, and about 70% Ga.

According to example embodiments, the transistor device is of the nFET type, wherein the epitaxially grown strained layer comprises $In_yGa_{1-y}As$, wherein the channel layer comprises $In_xGa_{1-x}As$, with $y>x$, and wherein the source and drain structures comprise $In_zGa_{1-z}As$, with $z<y$, and x, y and z being values in the range of [0,1].

According to example embodiments, the transistor device is of the nFET type, wherein the epitaxially grown strained layer comprises InGaAs, comprising about 70% In, and about 30% Ga, wherein the channel layer comprises InGaAs, comprising about 53% In, and about 47% Ga, and wherein the source and drain structures comprise InGaAs, comprising about 30% In, and about 70% Ga.

BRIEF DESCRIPTION OF THE FIGURES

The disclosure will be further elucidated by means of the following description and the appended figures.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

A first example embodiment of the present disclosure is illustrated by means of FIGS. 1(a) to 1(g). On a silicon substrate 1, a strained buffer layer 2 is epitaxially grown. The strained buffer layer 2 can comprise or consist for instance of SiGe or Si:C. A channel layer 3 is epitaxially grown on top of the strained buffer layer 2 (FIG. 1(a)). The channel layer 3 can for instance comprise or consist of Si or SiGe.

Figure 1A:
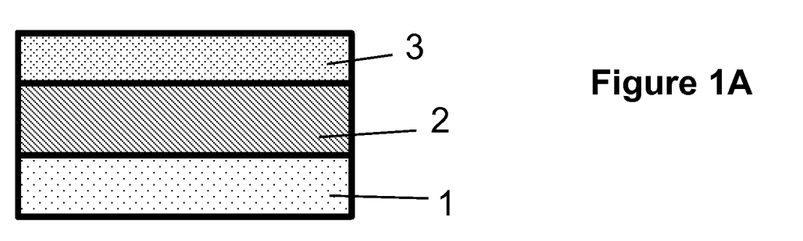
FIG. 1(a) to 1(g) illustrate a process flow according to a first embodiment of the present disclosure.
Figure 1B:
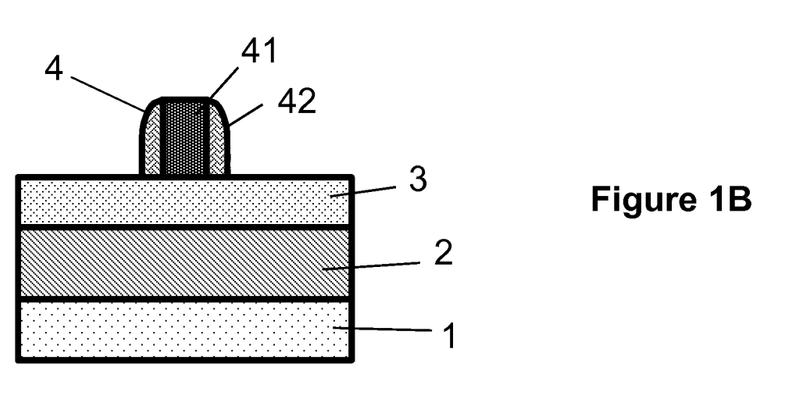

A dummy gate structure 4 is provided on top of the channel layer 3 (FIG. 1(b)). The dummy gate structure can comprise for instance a silicon dummy gate 41 and a set of spacers 42. Dummy gate structures may be formed using a variety of materials and methods.

Figures 1C, 1D:
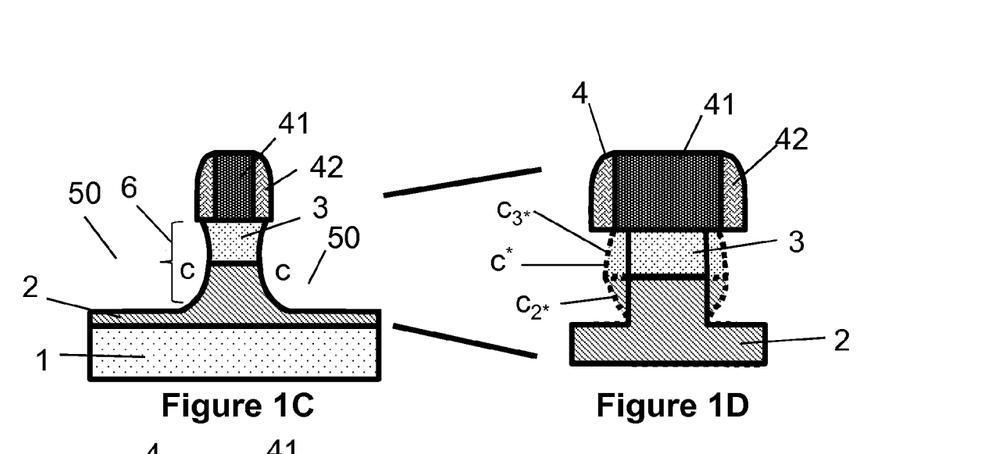
Figure 1E:
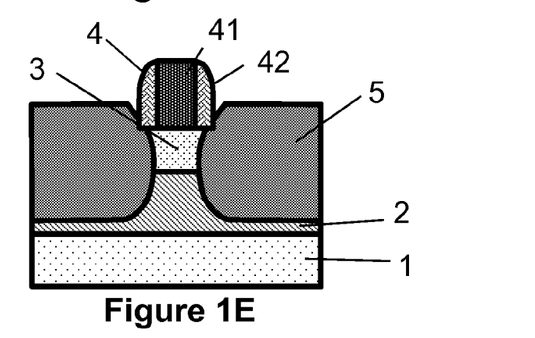

The dummy gate structure 4 is then used as an etching mask, for a selective etching process, as illustrated in FIG. 1(c). A selective etching process is performed etching the channel layer 3 and at least part of the strained buffer layer 2. The etching process should hereby not or only to a very limited extend affect the dummy gate structure. Hereby spaces 50 are created above an exposed upper surface of the strained layer, abutting the sidewalls of a protrusion 6 formed by the etching process, which extends from the substrate 1. This protrusion thus comprises a portion of the channel layer 3 and at least an upper portion of the epitaxially grown strained layer 2. The sidewalls of the protrusion 6 can be straight, i.e. the sidewall being perpendicular on the direction defined by the substrate's main surface. The profile of the sidewalls can have a curvature c for example can be inwardly curved, or can be outwardly curved. This nature of this curvature c can be predetermined by selecting appropriate etching chemistries and materials for the layer stack. A variety of etching chemistries and etching processes are contemplated herein.

The fact that spaces 50 are created adjacent to the protrusion 6, at the same time defining the protrusions, allows stresses, previously built up in the layer stack, to be redistributed by means of an elastic relaxation process. Indeed, the portion of the channel layer 3 and at least upper portion of the strained layer 2 are defined and thereby exposed laterally. This will cause a lateral expansion of these portions, resulting in a new curvature c* (curvature c2* for portion of layer 2 and c3* for portion of layer 3) of the sidewalls of the protrusion 6. The expansion illustrated in FIG. 1(d) is exaggerated. Indeed, in general, inwardly curved sidewalls are expected to be remaining inwardly curved, and outwardly curved sidewalls are expected to remain outwardly curved. The relative lateral expansion of the respective portions along a direction parallel with the front surface of the substrate can be for instance be more than 1%, or more than 0.5% or more than 0.1%, depending on the materials chosen for the different layers and the substrate. The elastic relaxation of the (portion of the) strained layer 2 will introduce stress in the portion of the channel layer 3.

Figure 1F:
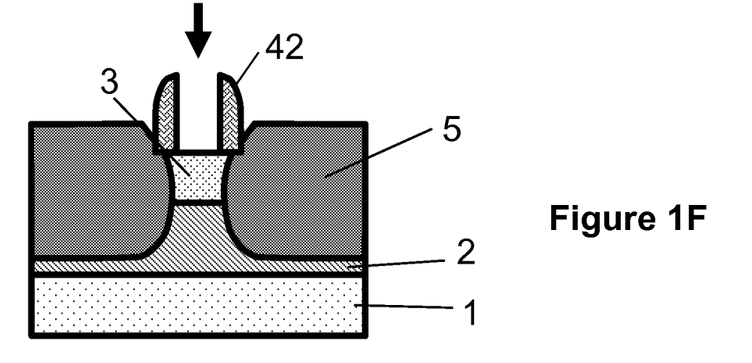
Figure 1G:
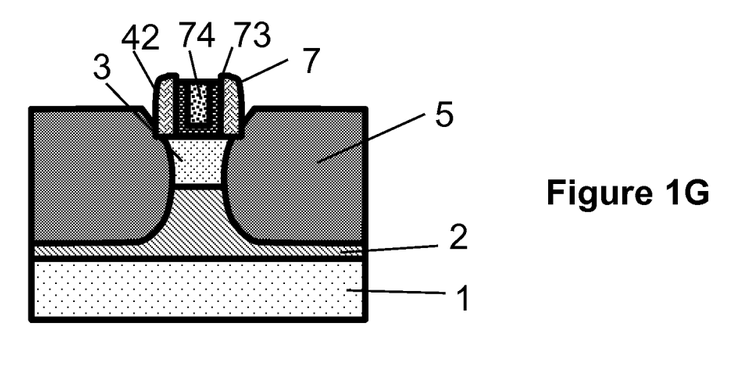

Next, source and drain structures 5 are grown epitaxially directly adjacent to the protrusion 6, at opposite sides thereof, on the sidewalls of the protrusion 6 as well as on the exposed upper surface of the strained layer 2, as illustrated in FIG. 1(f) for instance. These structures can for instance comprise SiGe or Si:C. A physical interface between the source and drain regions and the protrusion's sidewalls is hereby created. The source and drain structures may further introduce stress in the channel layer 3. The overall introduced stress in the channel layer 3 can be controlled, and may be predetermined by an appropriate selection of materials and process conditions.

The dummy gate structure 4 can now be replaced by a final gate structure 7. The dummy gate 41 is selectively removed and replaced by a final gate stack comprising at least a dielectric layer 73 and a metal layer or layer stack 74 (FIG. 1(g)).

Figure 2A:
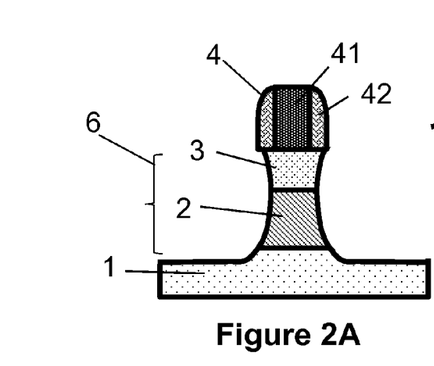
FIG. 2(a) to 2(e) illustrate a process flow according to a second embodiment of the present disclosure.
Figure 2B:
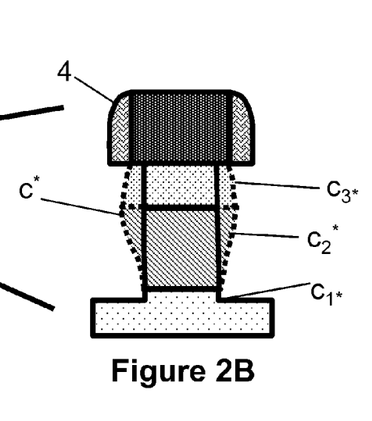

According to a second embodiment of the present disclosure, illustrated in FIGS. 2(a) to 2(e), a similar method is performed, with the difference that the selective etching step, which may comprise a sequence of different etching processes, is performed completely through the strained layer 2 (FIG. 2(a)) and partially into the underlying substrate 1, creating spaces above an exposed upper surface of the substrate, abutting the sidewalls of a protrusion 6 formed by the etching process. The protrusion 6 then also comprises an upper portion of the underlying substrate 1. The upper portion of the substrate is now also able to contribute in the stress redistribution. The outer sidewalls of the protrusion 6, illustrated in FIG. 2(b) comprises a curvature c* (curvature c1* for portion of substrate 1, curvature c2* for portion of layer 2 and c3* for portion of layer 3) after elastic relaxation of the layers.

Figure 2C:
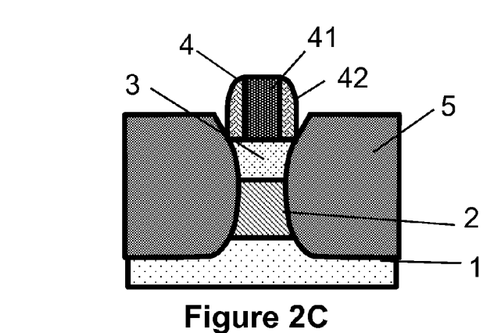

Then, source and drain structures 5 are grown epitaxially directly adjacent to the protrusion 6, at opposite sides thereof, on the sidewalls of the protrusion as well as on the exposed upper surface of the substrate, as illustrated in FIG. 2(c), similar as in the first embodiment. A physical interface between the source and drain regions and the protrusion's sidewalls is hereby created.

Figure 2D:
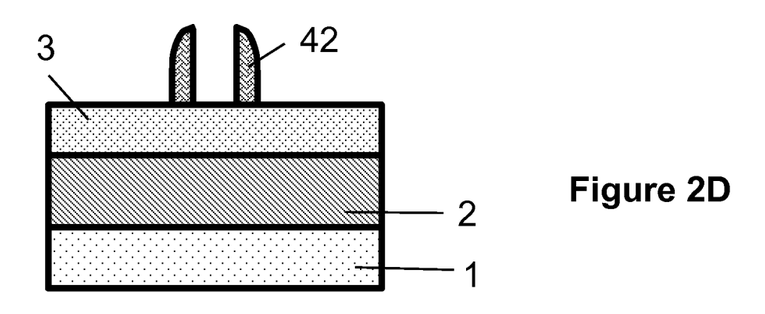
Figure 2E:
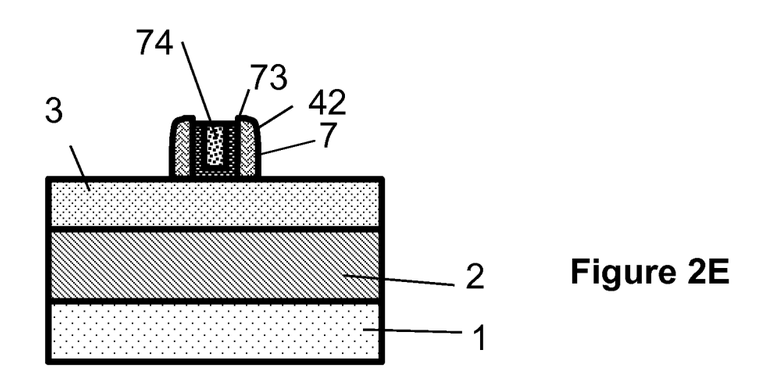

The dummy gate structure 4 is then replaced by a final gate structure 7. The dummy gate 41 is selectively removed and replaced by a final gate stack comprising at least a dielectric layer 73 and a metal layer or layer stack 74 (FIGS. 2(d) and (e)).

A third embodiment of the present disclosure is disclosed in FIG. 3(a) to (c), which is similar to the first embodiment, but instead of providing a dummy gate structure 4 and replacing it with a final gate structure later on in the process flow, a final gate structure 7 is provided directly.

Figure 3A:
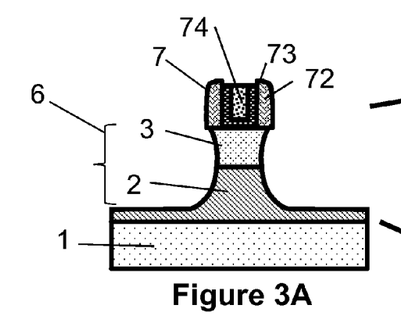
FIG. 3(a) to 3(c) illustrate a process flow according to a third embodiment of the present disclosure.
Figure 3B:
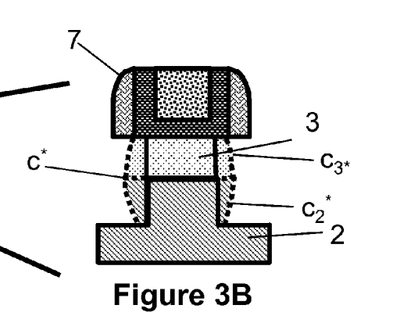

An etching step is performed etching selectively into the channel layer and partially in the epitaxially grown strained layer, thereby using the final gate structure 7 as a mask (FIGS. 3(a) and (b)), and thereby creating a protrusion 6 extending from the substrate 1, the protrusion 6 comprising a portion of the channel layer 3 and at least an upper portion of the epitaxially grown strained layer 2, allowing elastic relaxation in these portions.

Alternatively, the selective etching step, which may comprise a sequence of different etching processes, is performed completely through the strained layer 2 and partially into the underlying substrate 1, similar as to what is described for the second embodiment of the present disclosure.

Figure 3C:
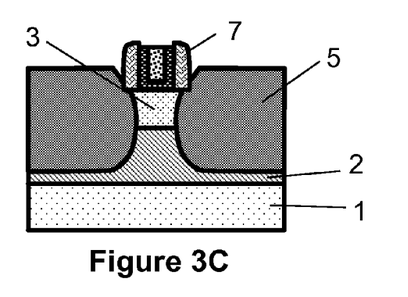

Thereafter, source and drain structures 5 are grown epitaxially directly adjacent to the protrusion 6, at opposite sides thereof, on the sidewalls of the protrusion as well as on the exposed upper surface of the underlying layer, for instance the strained layer or substrate, as illustrated in FIG. 3(c), similar as in the first and second embodiments. A physical interface between the source and drain regions and the protrusion's sidewalls is hereby created.

The choice of materials constituting or being comprised in the respective layers, as well as the substrate, allows determining the eventual stress redistribution.

Figure 4:
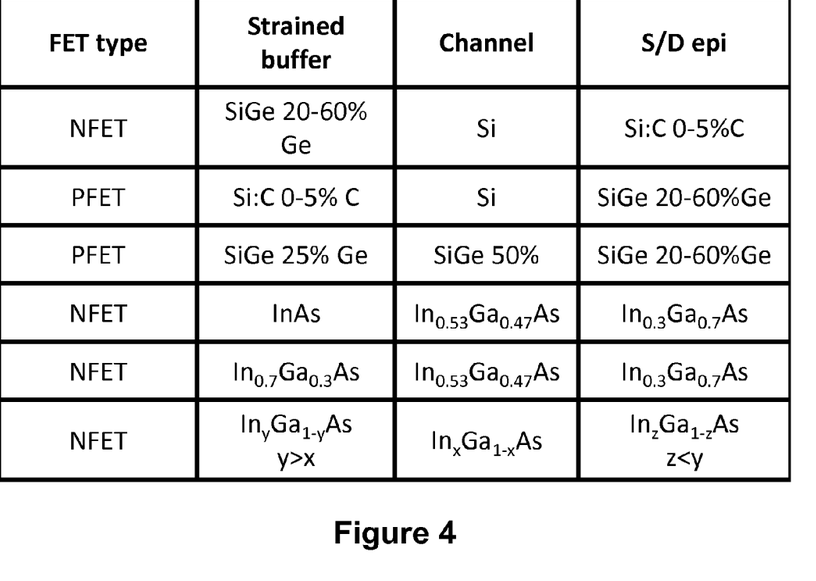
FIG. 4 shows an overview of example material systems for use in embodiments of the present disclosure.

Example material combinations are shown in FIG. 4.

According to example embodiments, the transistor device is of the nFET type, wherein the epitaxially grown strained layer comprises SiGe with a germanium concentration in between 20 and 60%, wherein the channel layer comprises Silicon, and wherein the source and drain structures comprise Si:C, with a concentration of C being in between 0 and 5%.

According to example embodiments, the transistor device is of the pFET type, wherein the epitaxially grown strained layer comprises Si:C, with a concentration of C being in between 0 and 5%, wherein the channel layer comprises Silicon, and where the source and drain structures comprise SiGe with a germanium concentration in between 20 and 60%.

According to example embodiments, the transistor device is of the pFET type, wherein the epitaxially grown strained layer comprises SiGe with a Germanium concentration of about 25%, wherein the channel layer comprises SiGe with a Germanium concentration higher than 30% (e.g. about 50%), and where the source and drain structures comprise SiGe with a germanium concentration in between 20 and 60%.

According to example embodiments, the transistor device is of the nFET type, wherein the epitaxially grown strained layer comprises InAs, wherein the channel layer comprises InGaAs, comprising about 53% In, and about 47% Ga, and wherein the source and drain structures comprise InGaAs, comprising about 30% In, and about 70% Ga.

According to example embodiments, the transistor device is of the nFET type, wherein the epitaxially grown strained layer comprises $In_yGa_{1-y}As$, wherein the channel layer comprises $In_xGa_{1-x}As$, with $y>x$, and wherein the source and drain structures comprise $In_zGa_{1-z}As$, with $z<y$, and $x$, $y$ and $z$ being values in the range of [0,1].

According to example embodiments, the transistor device is of the nFET type, wherein the epitaxially grown strained layer comprises InGaAs, comprising about 70% In, and about 30% Ga, wherein the channel layer comprises InGaAs, comprising about 53% In, and about 47% Ga, and wherein the source and drain structures comprise InGaAs, comprising about 30% In, and about 70% Ga.

What is claimed is:

1. A method for manufacturing a transistor device comprising a channel layer, said method comprising:
   providing a substrate;
   epitaxially growing a strained layer on said substrate;
   epitaxially growing said channel layer on said epitaxially grown strained layer;
   providing a first gate structure on said channel layer;
   selectively etching into said channel layer and at least partially in said epitaxially grown strained layer, thereby using said first gate structure as a mask, and thereby creating a protrusion extending from said substrate, said protrusion comprising a portion of said channel layer and at least an upper portion of said epitaxially grown strained layer, allowing elastic relaxation in said portions;

epitaxially growing source and drain structures directly adjacent to said protrusion and at opposed sides of the protrusion; and after epitaxially growing said source and drain structures directly adjacent to said protrusion, replacing said first gate structure by a second gate structure.

2. The method according to claim 1, comprising etching through said epitaxially grown strained layer and at least partially into said substrate, such that said protrusion further comprises an upper portion of said substrate.

3. The method according to claim 1, wherein selectively etching into said channel layer and at least partially in said epitaxially grown strained layer results in an inwardly curved sidewall of said protrusion.

4. The method according to claim 1, wherein epitaxially growing the strained layer on said substrate comprises providing a plurality of sub-layers.

5. The method according to claim 1, wherein said selective etching comprises plasma-enhanced etching with hydrogen bromide (HBr), oxygen ($O_2$), carbon tetrafluoride ($CF_4$) or nitrogen trifluoride ($NF_3$) chemistries.

6. The method according to claim 1, wherein said second gate structure comprises at least a dielectric layer and a metal layer stack.

7. The method according to claim 1, wherein said substrate is a silicon substrate.

8. The method according to claim 1, wherein said transistor device is of the nFET type, wherein said epitaxially grown strained layer comprises silicon germanium (SiGe) with a germanium concentration in between 20% and 60%, wherein said channel layer comprises silicon (Si), and wherein said source and drain structures comprise silicon carbide (Si:C), with a concentration of carbon (C) being in between 0% and 5%.

9. The method according to claim 1, wherein said transistor device is of the pFET type, wherein said epitaxially grown strained layer comprises silicon carbide (Si:C), with a concentration of carbon (C) being in between 0% and 5%, wherein said channel layer comprises silicon (Si), and where said source and drain structures comprise silicon germanium (SiGe) with a germanium concentration in between 20% and 60%.

10. The method according to claim 1, wherein said transistor device is of the pFET type, wherein said epitaxially grown strained layer comprises silicon germanium (SiGe) with a germanium concentration of about 25%, wherein said channel layer comprises SiGe with a germanium concentration higher than 30%, and where said source and drain structures comprise SiGe with a germanium concentration in between 20% and 60%.

11. The method according to claim 1, wherein the transistor device is of the nFET type, wherein the epitaxially grown strained layer comprises indium arsenide (InAs), wherein the channel layer comprises indium gallium arsenide (InGaAs), comprising about 53% indium (In), and about 47% gallium (Ga), and wherein the source and drain structures comprise InGaAs, comprising about 30% In, and about 70% Ga.

12. The method according to claim 1, wherein the transistor device is of the nFET type, wherein the epitaxially grown strained layer comprises indium gallium arsenide ($In_yGa_{1-y}As$), wherein the channel layer comprises $In_xGa_{1-x}As$, with y>x, and wherein the source and drain structures comprise $In_zGa_{1-z}As$, with z<y.

13. A method for manufacturing a transistor device comprising a channel layer, said method comprising:

providing a substrate;

epitaxially growing a strained layer on said substrate;

epitaxially growing said channel layer on said epitaxially grown strained layer;

providing a gate structure on said channel layer; and selectively etching into said channel layer and at least partially in said epitaxially grown strained layer, thereby using said gate structure as a mask, and thereby creating a protrusion extending from said substrate, said protrusion comprising a portion of said channel layer and at least an upper portion of said epitaxially grown strained layer, allowing elastic relaxation in said portions; and epitaxially growing source and drain structures adjacent to said protrusion, wherein said transistor device is of the nFET type, and comprises one of the following combinations:

a) wherein said epitaxially grown strained layer comprises silicon germanium (SiGe) with a germanium concentration in between 20% and 60%, wherein said channel layer comprises silicon (Si), and wherein said source and drain structures comprise silicon carbide (Si:C), with a concentration of carbon (C) being in between 0% and 5%;

b) wherein said epitaxially grown strained layer comprises indium arsenide (InAs), wherein the channel layer comprises indium gallium arsenide (InGaAs), comprising about 53% indium (In), and about 47% gallium (Ga), and wherein the source and drain structures comprise InGaAs, comprising about 30% In, and about 70% Ga; or c) wherein said epitaxially grown strained layer comprises indium gallium arsenide ($In_yGa_{1-y}As$), wherein the channel layer comprises $In_xGa_{1-x}As$, with y>x, and wherein the source and drain structures comprise $In_zGa_{1-z}As$, with z<y.

14. A method for manufacturing a transistor device comprising a channel layer, said method comprising:

providing a substrate;

epitaxially growing a strained layer on said substrate;

epitaxially growing said channel layer on said epitaxially grown strained layer;

providing a gate structure on said channel layer;

selectively etching into said channel layer and at least partially in said epitaxially grown strained layer, thereby using said gate structure as a mask, and thereby creating a protrusion extending from said substrate, said protrusion comprising a portion of said channel layer and at least an upper portion of said epitaxially grown strained layer, allowing elastic relaxation in said portions; and epitaxially growing source and drain structures adjacent to said protrusion, wherein said transistor device is of the pFET type, and comprises one of the following combinations:

a) wherein said epitaxially grown strained layer comprises silicon carbide (Si:C), with a concentration of carbon (C) being in between 0% and 5%, wherein said channel layer comprises silicon (Si), and where said source and drain structures comprise silicon germanium (SiGe) with a germanium concentration in between 20% and 60%; or b) wherein said epitaxially grown strained layer comprises silicon germanium (SiGe) with a germanium concentration of about 25%, wherein said channel layer comprises SiGe with a germanium concentration higher than 30%, and where said source and drain structures comprise SiGe with a germanium concentration in between 20% and 60%.

* * * * *